United States Patent
Shimoda

(10) Patent No.: US 6,631,490 B2
(45) Date of Patent: Oct. 7, 2003

(54) ENCODING UNIT AND DECODING UNIT

(75) Inventor: Kaneyasu Shimoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 465 days.

(21) Appl. No.: 09/760,673

(22) Filed: Jan. 16, 2001

(65) Prior Publication Data

US 2002/0049949 A1 Apr. 25, 2002

(30) Foreign Application Priority Data

Jul. 7, 2000 (JP) ......................................... 2000-207448

(51) Int. Cl.[7] .......................... H03M 13/00; G11C 29/00
(52) U.S. Cl. ........................................ 714/755; 714/769
(58) Field of Search ................................ 714/755, 752, 714/746, 757, 775, 779, 769, 770, 771; 360/22, 23, 24, 39, 131; 341/59, 94

(56) References Cited

U.S. PATENT DOCUMENTS

| 4,571,575 A | * | 2/1986 | McCullough | 360/40 |
| 5,862,157 A | * | 1/1999 | Bessios | 714/799 |
| 6,009,549 A | * | 12/1999 | Bliss et al. | 714/769 |
| 6,198,413 B1 | * | 3/2001 | Widmer | 341/59 |

* cited by examiner

*Primary Examiner*—Christine T. Tu
(74) *Attorney, Agent, or Firm*—Greer, Burns & Crain, Ltd.

(57) ABSTRACT

An encoding unit includes a separating section for separating a RLL code into a restricting portion corresponding to a basic code and a non-restricting portion corresponding to information bits, a first encoding section for adding an error correction code to the restricting portion and carrying out a RLL encoding, a second encoding section for adding an error correction code to the non-restricting portion, and an interleaving section for interleaving outputs of the first and second encoding means, and outputting encoded information.

11 Claims, 12 Drawing Sheets

ENCODING UNIT AND DECODING UNIT

BACKGROUND OF THE INVENTION

This application claims the benefit of a Japanese Patent Application No.2000-207448 filed Jul. 7, 2000, in the Japanese Patent Office, the disclosure of which is hereby incorporated by reference.

1. Field of the Invention

The present invention generally relates to encoding units and decoding units, and more particularly to an encoding unit and a decoding unit which use a run length limited (RLL) code and an error correction code (ECC).

2. Description of the Related Art

In a conventional magnetic recording and/or reproducing apparatus such as a magnetic disk unit, the RLL code is used to facilitate extraction of a clock component or adjusting synchronization, and the ECC such as a Reed Solomon code is used for the error correction, when recording information on and reproducing information from a magnetic recording medium. Hence, a high-density information recording and reproduction can be carried out with a high reliability.

FIG. 1 is a system block diagram showing a first example of recording and reproducing systems of the conventional magnetic recording and reproducing apparatus.

In FIG. 1, a recording system generally includes a scrambler 1, an ECC encoder 2, a RLL encoder 3, a parity encoder 4, and a known recording means (not shown) for recording information on a recording medium 5. On the other hand, a reproducing system generally includes a known reproducing means (not shown) for reproducing the information from the recording medium 5, an equalizer 6, a most likelihood detector 7, a RLL decoder 8, an ECC decoder 9, and a descrambler 10.

The information which is to be recorded on the recording medium 5 is scrambled in the scrambler 1, and is added with a parity byte in the ECC encoder 2. The RLL encoder 3 subjects the information which is scrambled and added with the parity byte to a RLL encoding. The parity encoder 4 subjects a parity byte portion to a RLL encoding. Hence, encoded information is recorded on the recording medium 5 by the recording means. On the other hand, the encoded information which is reproduced from the recording medium 5 by the reproducing means is supplied to the most likelihood detector 7 via the equalizer 6, and is converted into the RLL code by a most likelihood detection. The RLL decoder 8 subjects the RLL code output from the most likelihood detector 7 to a RLL decoding. The ECC decoder 9 carries out an error correction with respect to the RLL decoded information. The descrambler 10 descrambles the decoded and error-corrected information, so as to reproduce the recorded information.

However, according to this first example, the RLL code word itself becomes long when the code efficiency of the RLL code is increased. Hence, when an error exists in a portion of the RLL code, the error is propagated over a long range by the decoding process, thereby deteriorating a burst error correcting performance of the ECC.

FIG. 2 is a system block diagram showing a second example of the recording and reproducing systems of the conventional magnetic recording and reproducing apparatus, which has been proposed to eliminate the problems of the first example described above. In FIG. 2, the illustration of the recording means, the recording medium and the reproducing means is omitted for the sake of convenience. In this second example, the ECC encoder and the RLL encoder of the recording system are provided in a reverse order to that of the first example, and the RLL decoder and the ECC decoder of the reproducing system are provided in a reverse order to that of the first example.

In FIG. 2, the recording system includes a scrambler 11, a RLL1 encoder 12, and an ECC encoder 13, where RLL1 indicates a first RLL encoding. On the other hand, the reproducing system includes an ECC decoder 15, a RLL1 decoder 16, and a descrambler 17.

The RLL1 encoder 12 subjects the information which is scrambled in the scrambler 11 to a RLL1 encoding, and the ECC encoder 13 encodes the RLL1-encoded information by ECC. More particularly, the ECC encoder 13 includes a RLL2 encoder 131, and subjects the parity byte to a RLL2 encoding and adds the RLL2-encoded information to the RLL1-encoded information, where RLL2 indicates a second RLL encoding, because the parity byte which is to be added does not satisfy the rules of the RLL1 code. The RLL2-encoded RLL1-encoded information is recorded on the recording medium by the recording means, and the recorded information is reproduced from the recording medium by the reproducing means.

The reproduced encoded information is supplied to the ECC decoder 15. The ECC decoder 15 includes a RLL2 decoder 151, and subjects the RLL2-encoded parity byte to a RLL2 decoding, so as to correct the error of the RLL1-encoded information. The RLL1 decoder 16 subjects the error-corrected RLL1 encoded data to a RLL1 decoding, and the descrambler 17 descrambles the decoded information so as to reproduce the recorded information.

However, when the RLL-encoded information is encoded by the ECC in the second example, the added parity byte does not satisfy the rules of the RLL code. For this reason, it is necessary to further carry out the RLL encoding with respect to the parity byte, and it is thus necessary to employ a complicated format using double codes. As a result, it takes time to carry out the correction process using the ECC in the reproducing system, thereby increasing the number of buffer circuits which are required to absorb delays and also increasing the scale of the circuit.

SUMMARY OF THE INVENTION

Accordingly, it is a general object of the present invention to provide a novel and useful encoding unit and decoding unit, in which the problems described above are eliminated.

Another and more specific object of the present invention is to provide an encoding unit and a decoding unit which can suppress error propagation and improve error correcting performance of ECC, without increasing the scale of the circuit.

Still another object of the present invention is to provide an encoding unit comprising separating means for separating a RLL code into a restricting portion corresponding to a basic code and a non-restricting portion corresponding to information bits, first encoding means for adding an error correction code to the restricting portion and carrying out a RLL encoding, second encoding means for adding an error correction code to the non-restricting portion, and interleaving means for interleaving outputs of the first and second encoding means, and outputting encoded information. According to the encoding unit of the present invention, it is possible to suppress error propagation and improve error correcting performance of ECC, without increasing the scale of the circuit.

A further object of the present invention is to provide a decoding unit for decoding encoded information in which first and second information are interleaved, where the first information is subjected to a RLL encoding by adding a parity to a restricting portion which corresponds to a basic code of a RLL code and the second information is added with an error correction code to a non-restricting portion which corresponds to information bits of the RLL code, comprising separating means for separating the encoded information into the first and second information, first decoding means for subjecting the separated first information to a RLL decoding and an error correction, second decoding means for subjecting the separated second information to an error correction, and interleaving means for interleaving outputs of the first and second decoding means, and outputting decoded information. According to the decoding unit of the present invention, it is possible to suppress error propagation and improve error correcting performance of ECC, without increasing the scale of the circuit.

Other objects and further features of the present invention will be apparent from the following detailed description when read in conjunction with the accompanying drawings.

DESCRIPTION OF THE PREFERRED EMBODIMENTS

A description will be given of various embodiments of an encoding unit according to the present invention and a decoding unit according to the present invention, by referring to FIG. 3 and the subsequent drawings.

Figure 1:
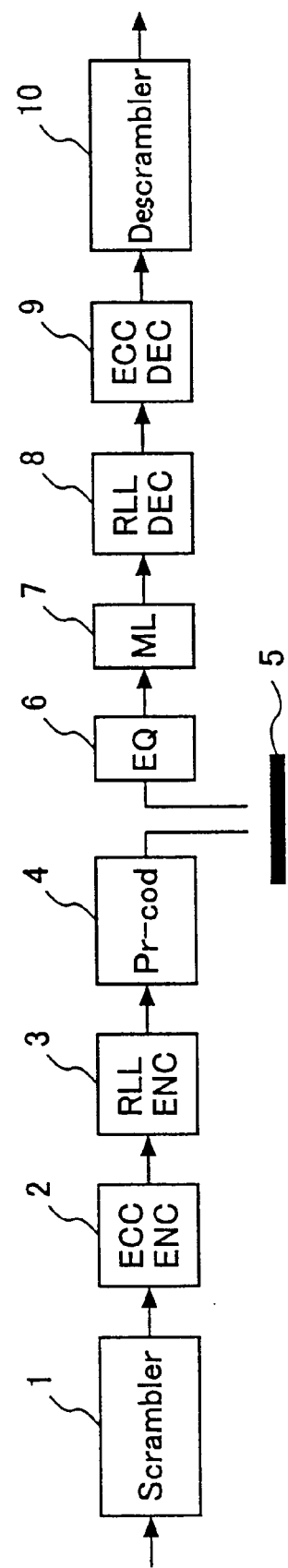
FIG. 1 is a system block diagram showing a first example of recording and reproducing systems of the conventional magnetic recording and reproducing apparatus.
Figure 2:
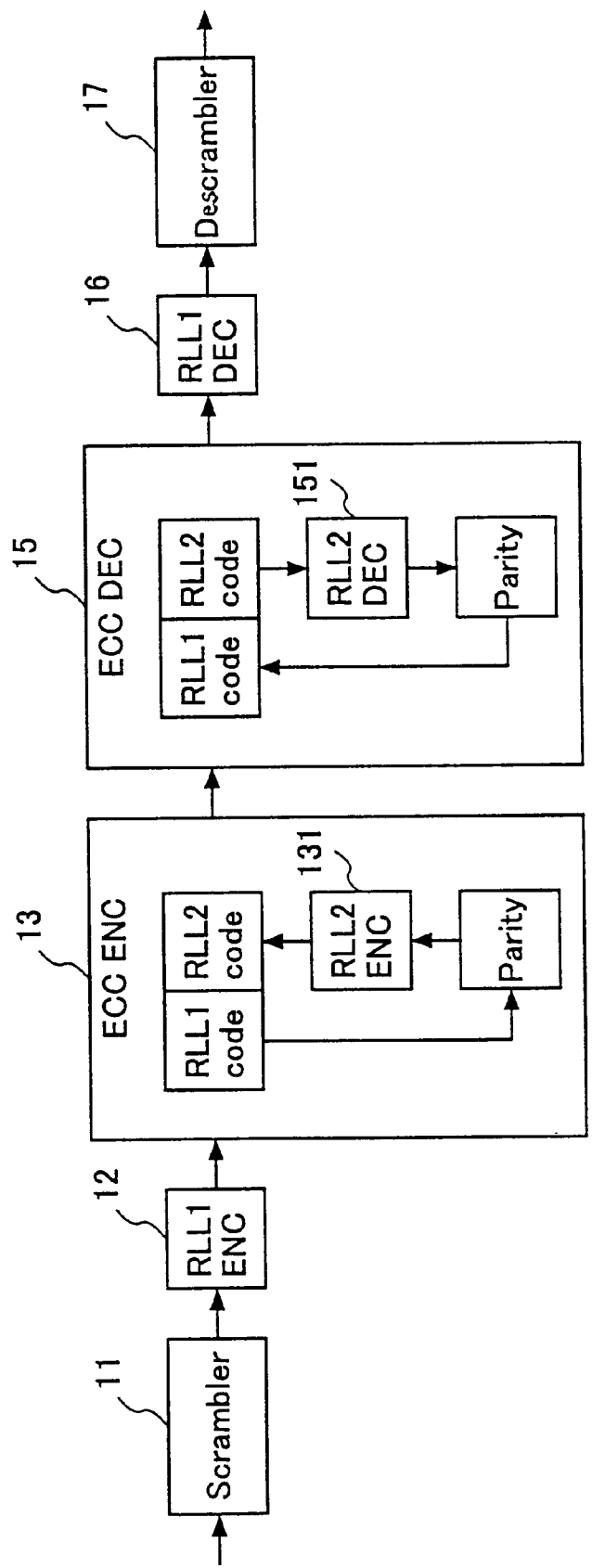
FIG. 2 is a system block diagram showing a second example of the recording and reproducing systems of the conventional magnetic recording and reproducing apparatus.
Figure 3:
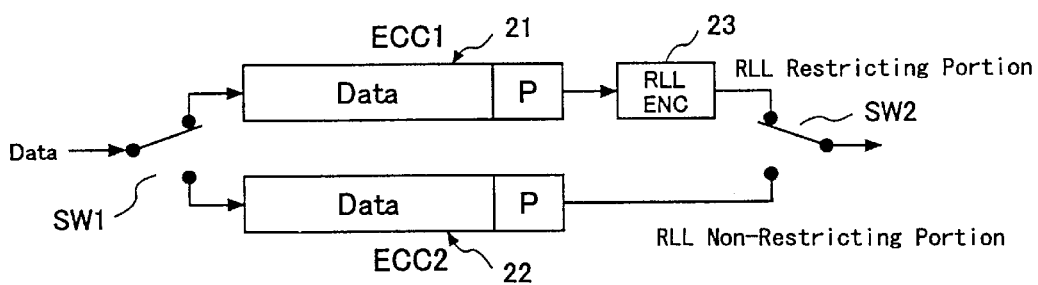
FIG. 3 is a diagram showing a first embodiment of an encoding unit according to the present invention.
Figure 4:
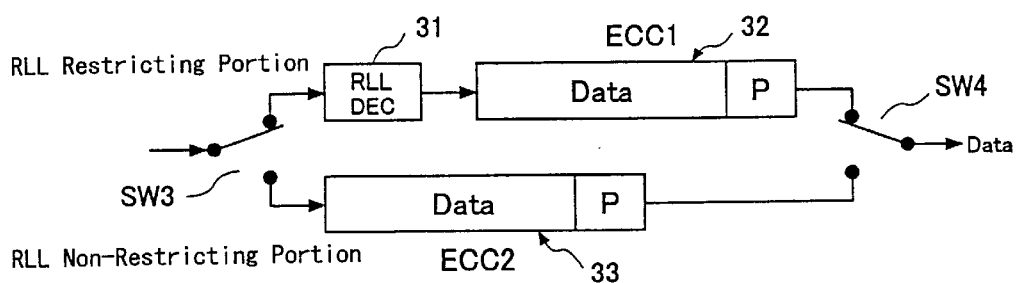
FIG. 4 is a diagram showing a first embodiment of a decoding unit according to the present invention.

FIG. 3 is a diagram showing a first embodiment of the encoding unit according to the present invention, and FIG. 4 is a diagram showing a first embodiment of the decoding unit according to the present invention. In FIGS. 3 and 4 and the subsequent drawings, it is assumed for the sake of convenience that "Data" indicates an information (data) portion and "P" indicates a parity portion.

A recording system includes a switch SW1, an ECC1 encoder 21, an ECC2 encoder 22, a RLL encoder 23 and a switch SW2 which are connected as shown in FIG. 3. A data to be recorded on a recording medium (not shown) is input to the switch SW1. The switch SW1 is switched based on a synchronizing byte (SB or, synchronizing word) which indicates the start of the data, for example, so that the data amounting to one sector, that is, 512 bytes, is alternately separated into a restricting portion and a non-restricting portion for every one byte. The restricting portion corresponds to a basic code of the RLL code, and the non-restricting portion corresponds to information bits of the RLL code. The restricting portion is added with a parity byte in the ECC1 encoder 21, and is converted into a 9-bit data for every one byte including the parity byte, that is, into a RLL code, in the RLL encoder 23. The RLL code from the RLL encoder 23 is supplied to the switch SW2 as a RLL restricting portion. On the other hand, the non-restricting portion is added with a parity byte in the ECC2 encoder 22, and is supplied to the switch SW2 as a RLL non-restricting portion. The switch SW2 is switched at timings based on the synchronizing byte, for example, so that the RLL non-restricting portion is mixed into the RLL restricting portion and output from the switch SW2 to be recorded on the recording medium by a recording means (not shown).

A reproducing system includes a switch SW3, a RLL decoder 31, an ECC1 decoder 32, an ECC2 decoder 33 and a switch SW4 which are connected as shown in FIG. 4. Encoded information which is reproduced from the recording medium (not shown) by a reproducing means (not shown) is input to the switch SW3. The switch SW3 is switched at timings based on the synchronizing byte, for example, and is separated into the RLL restricting portion and the RLL non-restricting portion. The RLL restricting portion is returned to 1-byte portions for every nine bits in the RLL decoder 31, and is subjected to an error correction using ECC1 in the ECC1 decoder 32 before being supplied to the switch SW4. On the other hand, the RLL non-restricting portion is directly subjected to an error correction using ECC2 in the ECC2 decoder 33, and then supplied to the switch SW4. The switch SW4 is switched at timings based on the synchronizing byte, for example, so as to interleave the RLL restricting portion which is subjected to the RLL decoding and the error correction using ECC1, and the RLL non-restricting portion which is subjected to the error correction using ECC2. As a result, the RLL encoded information is subjected to the RLL decoding, to thereby reproduce the recorded information.

According to this embodiment, an error propagation can be suppressed to the basic code of the RLL code, and the error correcting performance of the ECC can be improved. In addition, this embodiment does not employ a double code or a complicated format which is conventionally employed. For this reason, it is possible to reduce the time required to carry out the error correction process using ECC in the reproducing system, and the increase of the circuit scale can positively be prevented.

Figure 5:
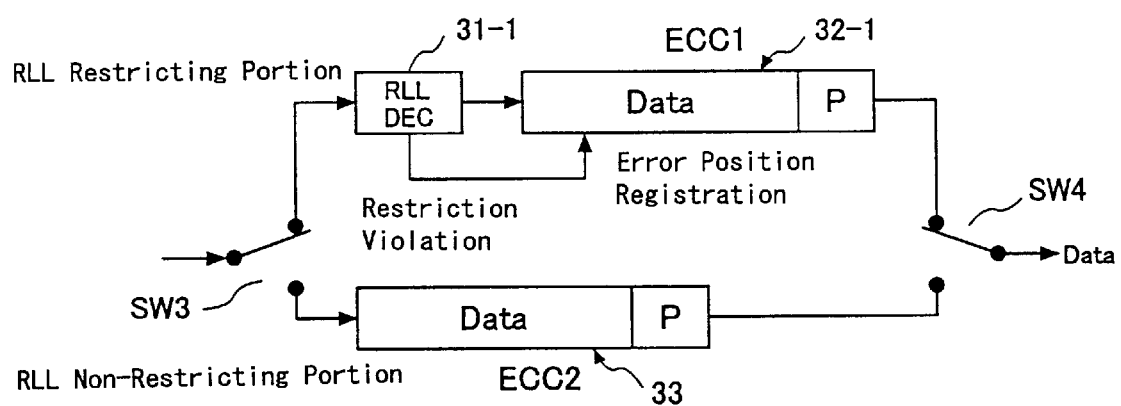
FIG. 5 is a diagram showing a second embodiment of the decoding unit according to the present invention.

Next, a description will be given of a second embodiment of the decoding unit according to the present invention. FIG. 5 is a diagram showing the second embodiment of the decoding unit. In FIG. 5, those parts which are the same as those corresponding parts in FIG. 4 are designated by the same reference numerals, and a description thereof will be omitted.

In this embodiment, a RLL decoder 31-1 and an ECC1 decoder 32-1 are provided with respect to the RLL restricting portion. The RLL decoder 31-1 notifies a restriction violation to the ECC1 decoder 32-1 when a reproduced signal string which violates the rules of the RLL restricting portion is detected. The ECC1 decoder 32-1 adds an error generated in the RLL restricting portion to an error location of the ECC1. In other words, the position where the error is generated in the RLL restricting portion is registered in the ECC1.

Figure 6:
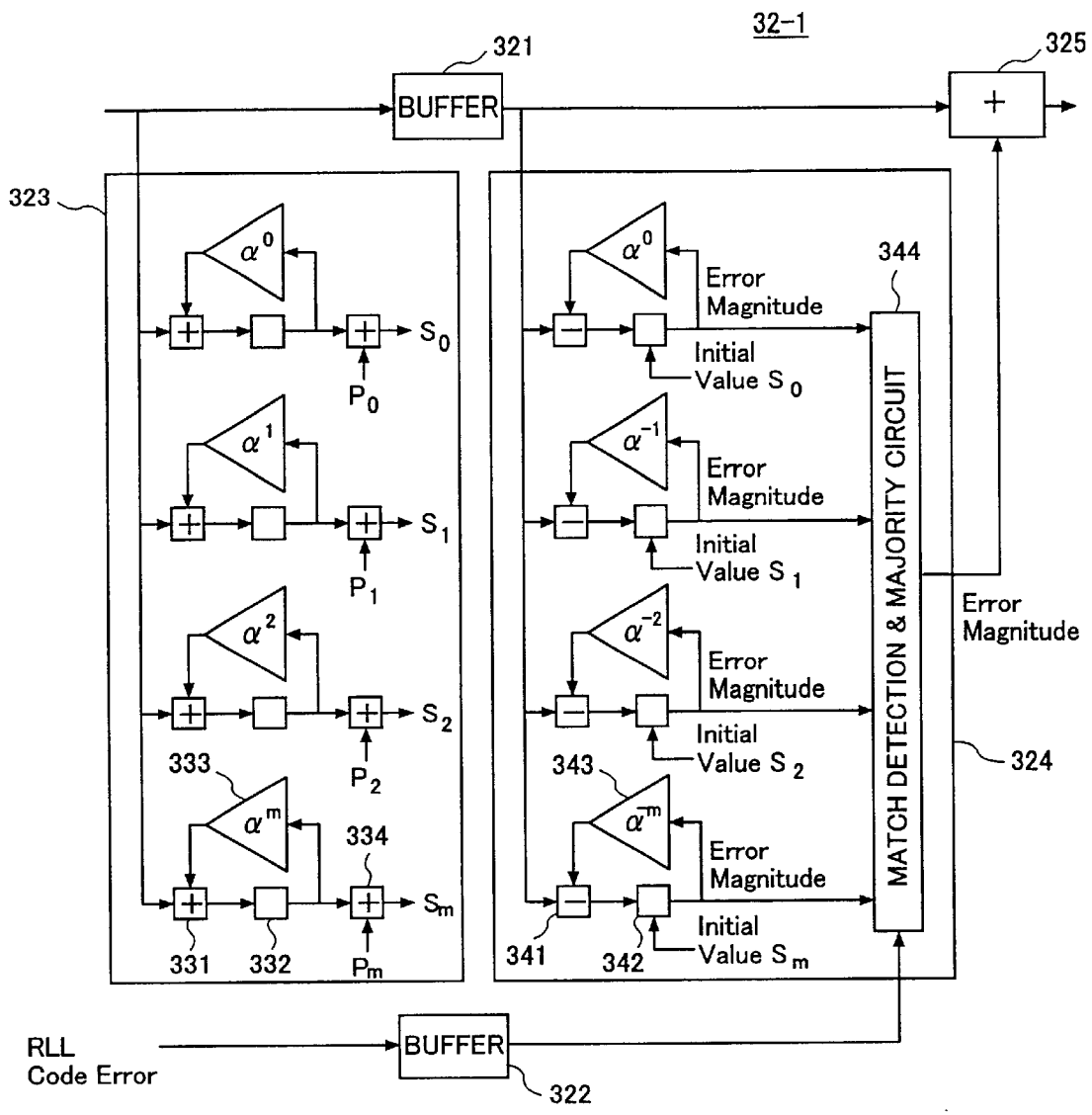
FIG. 6 is a diagram showing an ECC1 decoder of the second embodiment of the decoding unit.

FIG. 6 is a diagram showing the ECC1 decoder 32-1 of the encoding unit shown in FIG. 5. As shown in FIG. 6, the ECC1 decoder 32-1 includes buffers 321 and 322, a syndrome computing section 323, an error computing section 324 which computes the error location and the error magnitude, and an adder 325. The RLL-encoded RLL restricting portion from the RLL decoder 31-1 is input to the buffer 321. In addition, the RLL code error which is notified from the RLL decoder 31-1 is input to the buffer 322.

The syndrome computing section 323 is made up of a first circuit part which includes adders 331 and 334, a register 332 and a $\alpha^i$ multiplier 333 and is provided to compute a corresponding syndrome Si based on a parity Pi and the RLL restricting portion obtained from the RLL decoder 31-1, and one such first circuit part is provided with respect to each of i=0 to m.

The error computing section 324 is made up of a match detection and majority circuit 344 and a second circuit part which includes a subtracter 341, a register 342 and a $\alpha^{-i}$ multiplier 343 and is provided to compute a corresponding error magnitude based on an initial value of the syndrome Si and the RLL restricting portion obtained via the buffer 321, and one such second circuit part is provided with respect to each of i=0 to m. The match detection and majority circuit 344 judges the error magnitude based on the error magnitudes obtained from each of the second circuit parts and the RLL code error which is obtained via the buffer 322. The match detection and majority circuit 344 detects whether or not the RLL code error obtained via the buffer 322 matches the error computed in each of the second circuit parts within the error computing section 324, and obtains the error magnitude by majority if a mismatch is detected. The error magnitude from the match detection and majority circuit 344 is supplied to the adder 325. In other words, since the error position (error location) is definitely decided, it is possible to obtain the error magnitude by majority from the match of the syndromes judging the error position and the error magnitude. As a result, the error which is generated in the RLL restricting portion is added to the error location of the ECC1 by the adder 325, and the magnitude of the error generated in the RLL restricting portion can be detected from the output of the match detection and majority circuit 344. By registering the reproduced signal string which violates the rules of the RLL restricting portion to the error location, it is possible to improve the error correcting performance of the ECC1.

Figure 7:
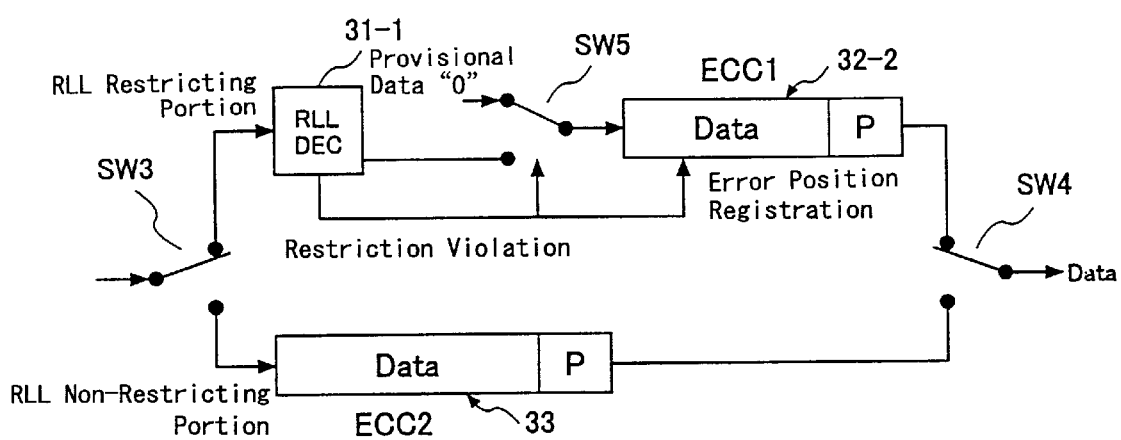
FIG. 7 is a diagram showing a third embodiment of the decoding unit according to the present invention.

Next, a description will be given of a third embodiment of the decoding unit according to the present invention. FIG. 7 is a diagram showing the third embodiment of the decoding unit. In FIG. 7, those parts which are the same as those corresponding parts in FIG. 5 are designated by the same reference numerals, and a description thereof will be omitted.

In this embodiment, a switch SW5 is provided between the RLL decoder 31-1 and the ECC1 decoder 32-2. The switch SW5 inputs to the ECC1 decoder 32-2 a provisional data "0" at one location corresponding to the restriction violation when the RLL decoder 31-1 detects a reproduced signal string which violates the rules of the RLL restricting portion. Based on the restriction violation notification from the RLL decoder 31-1 and the provisional data from the switch SW5, the ECC1 decoder 32-2 adds the error generated in the RLL restricting portion to the error location of the ECC1. In other words, the position of the error generated in the RLL restricting portion is registered in the ECC1.

Figure 8:
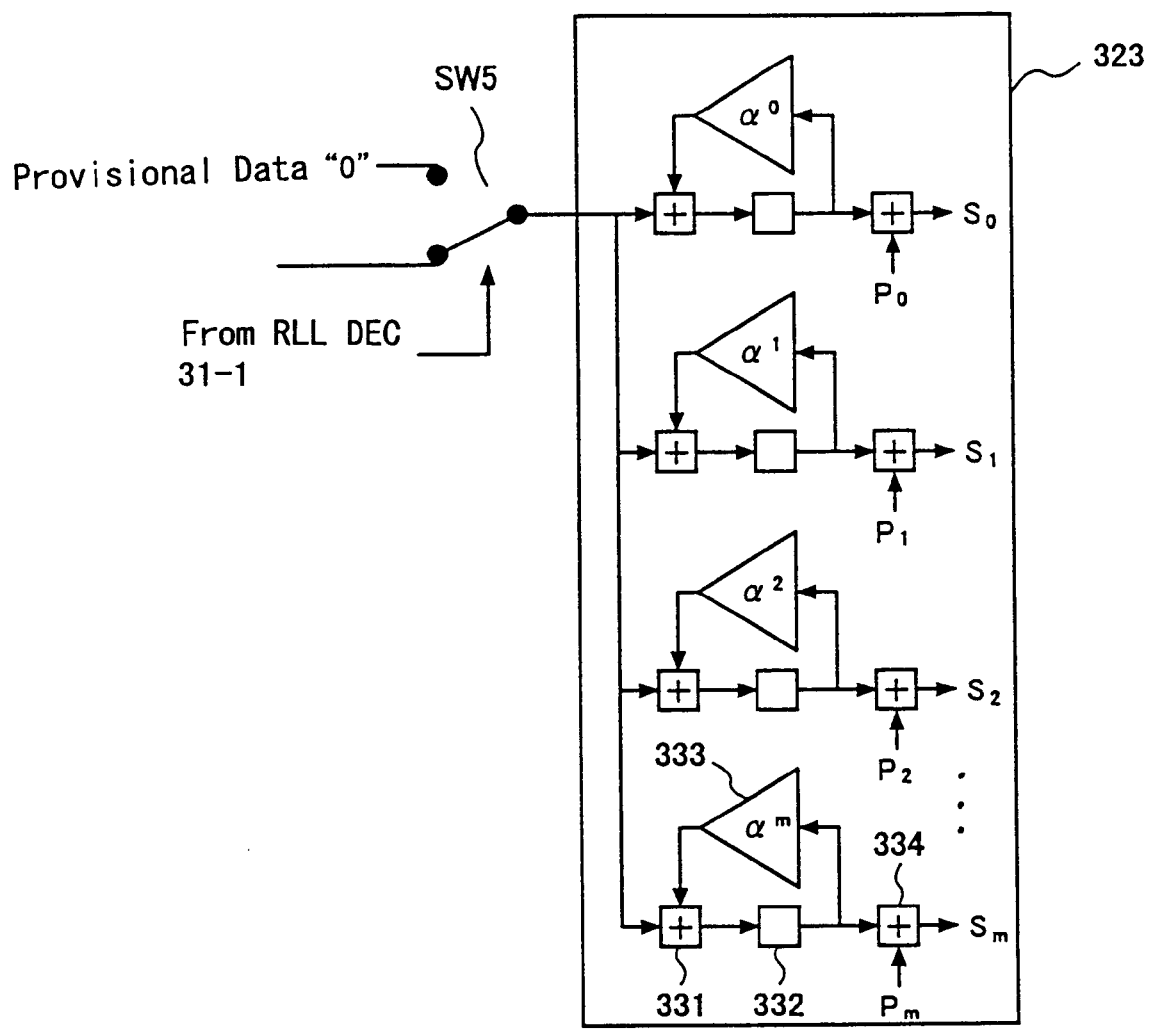
FIG. 8 is a diagram showing an ECC1 decoder of the third embodiment of the decoding unit.

FIG. 8 is a diagram showing the ECC1 decoder 32-2 of the decoding unit shown in FIG. 7. In FIG. 8, those parts which are the same as those corresponding parts in FIG. 6 are designated by the same reference numerals, and a description thereof will be omitted. The syndrome computing section 323 computes the following syndrome computing matrix, where Bi indicates an error.

$$\begin{bmatrix} S0 \\ S1 \\ S2 \\ \vdots \\ Sm \end{bmatrix} = \begin{bmatrix} 1 & 1 & 1 & \cdots & 1 \\ 1 & \alpha & \alpha^2 & \cdots & \alpha^n \\ 1 & \alpha^2 & \alpha^4 & \cdots & \alpha^{2n} \\ \vdots & \vdots & \vdots & \vdots & \vdots \\ 1 & \alpha^m & \alpha^{2m} & \cdots & \alpha^{nm} \end{bmatrix} \begin{bmatrix} B0 \\ B1 \\ B2 \\ \vdots \\ Bn \end{bmatrix}$$

When it is detected in the RLL decoder 31-1 that an error is generated at an ith location, the provisional data "0" is input to the ECC1 decoder 32-2 via the switch SW5 at this ith location in place of the RLL coded data string from the RLL decoder 31-1. Accordingly, the syndrome computing matrix is computed in the following manner in the syndrome computing section 323, and it is possible to obtain the error magnitude from the computed result. The processes carried out thereafter are the same as in the case of the second embodiment of the decoding unit described above.

$$\begin{bmatrix} S0 \\ S1 \\ S2 \\ \vdots \\ Sm \end{bmatrix} \begin{bmatrix} 1 & 1 & 1 & \cdots & 1 & \cdots & 1 \\ 1 & \alpha & \alpha^2 & \cdots & \alpha^i & \cdots & \alpha^n \\ 1 & \alpha^2 & \alpha^4 & \cdots & \alpha^{2i} & \cdots & \alpha^{2n} \\ \vdots & \vdots & \vdots & \vdots & \vdots & \vdots & \vdots \\ 1 & \alpha^m & \alpha^{2m} & \cdots & \alpha^{im} & \cdots & \alpha^{nm} \end{bmatrix} \begin{bmatrix} B0 \\ B1 \\ B2 \\ \vdots \\ Bi \leftarrow 0 \\ \vdots \\ Bn \end{bmatrix}$$

$$\begin{bmatrix} S0 \\ S1 \\ S2 \\ \vdots \\ Sm \end{bmatrix} = \begin{bmatrix} Bi \\ Bi\alpha^i \\ Bi\alpha^{2i} \\ \vdots \\ Bi\alpha^{mi} \end{bmatrix}$$

Figure 9:
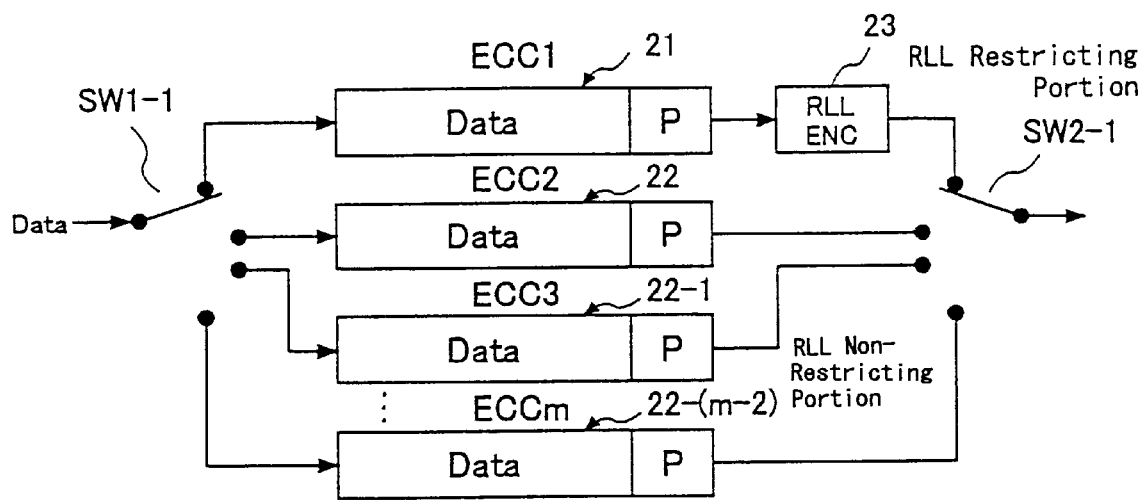
FIG. 9 is a diagram showing a second embodiment of the encoding unit according to the present invention.

Next, a description will be given of a second embodiment of the encoding unit according to the present invention. FIG. 9 is a diagram showing the second embodiment of the encoding unit. In FIG. 9, those parts which are the same as those corresponding parts in FIG. 3 are designated by the same reference numerals, and a description thereof will be omitted.

As shown in FIG. 9, a plurality of ECC encoders are provided with respect to the non-restricting portion of the RLL code in this embodiment. For the sake of convenience, it is assumed that the ECC2 encoder 22, an ECC3 encoder 22-1, ..., and an ECCm encoder 22-(m-2) are provided. By appropriately controlling the switching of switches SW1-1 and SW2-1, it is possible to further interleave the non-restricting portion in arbitrary units and to carry out the error correction using the ECC. In this embodiment, the interleaving of the non-restricting portion is made in units of bits. According to this embodiment, it is possible to improve the processing speed by the parallel processing of the non-restricting portion because the non-restricting portion is further interleaved, and it is possible to further suppress the propagation of the burst error.

Figure 10:
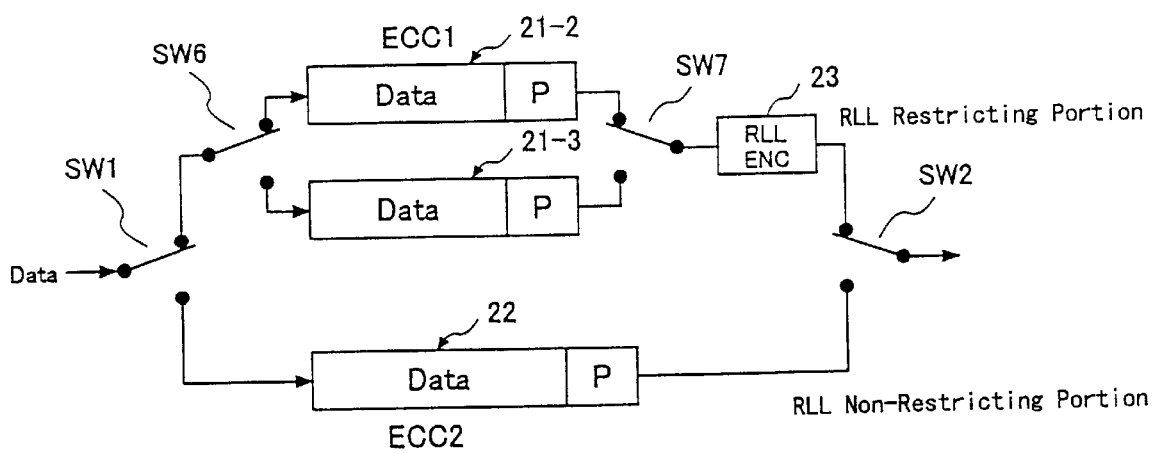
FIG. 10 is a diagram showing a third embodiment of the encoding unit according to the present invention.

Next, a description will be given of a third embodiment of the encoding unit according to the present invention. FIG. 10 is a diagram showing the third embodiment of the encoding unit. In FIG. 10, those parts which are the same as those corresponding parts in FIG. 3 are designated by the same reference numerals, and a description thereof will be omitted.

As shown in FIG. 10, a plurality of ECC encoders are provided with respect to the restricting portion of the RLL code in this embodiment. For the sake of convenience, it is assumed that ECC1 encoders 21-2 and 21-3 are provided. By appropriately controlling the switching of switches SW6 and SW7, it is possible to further interleave the restricting portion in arbitrary units and to carry out the error correction using the ECC. In this embodiment, the interleaving of the restricting portion is made in units of bits. According to this embodiment, it is possible to improve the processing speed by the parallel processing of the restricting portion because the restricting portion is further interleaved, and it is possible to further suppress the propagation of the burst error.

Figure 11:
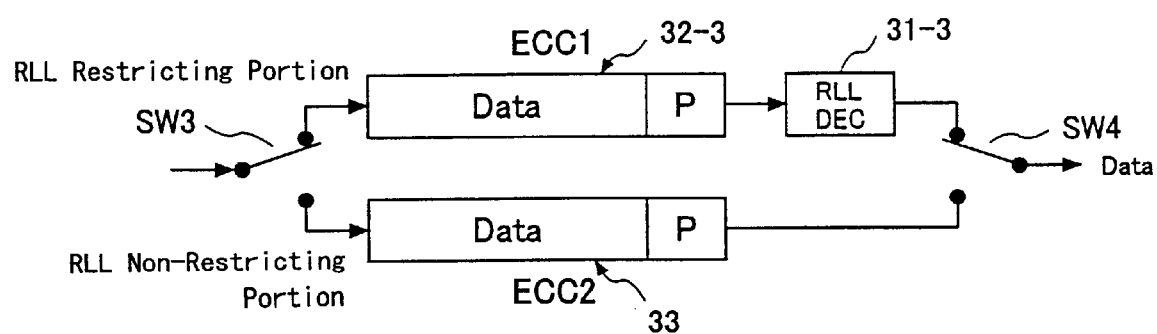
FIG. 11 is a diagram showing a fourth embodiment of the decoding unit according to the present invention.

Next, a description will be given of a fourth embodiment of the decoding unit according to the present invention. FIG. 11 is a diagram showing the fourth embodiment of the decoding unit. In FIG. 11, those parts which are the same as those corresponding parts in FIG. 4 are designated by the same reference numerals, and a description thereof will be omitted.

As shown in FIG. 11, in this embodiment, an ECC1 decoder 32-3 and a RLL decoder 31-3 which are provided with respect to the RLL restricting portion are arranged in an opposite order to that of the case shown in FIG. 4. In other words, the error correction using the ECC is carried out before the RLL restricting portion is subjected to the RLL decoding, by expanding the syndrome generation unit with respect to the RLL restricting portion. As a result, an aggregate which closes the addition and multiplication in the RLL restricting portion, that is, an extended Galois field which uses the RLL restricting portion as the field, can be used to correct the error of the RLL restricting portion by the ECC before the RLL restricting portion is subjected to the RLL decoding. The extended Galois field can be obtained from the following generation polynomial.

$$RLL(g(X)) = (RLL(X) - RLL(\alpha^0))(RLL(X) - RLL(\alpha^1))(RLL(X) - RLL(\alpha^2)) \ldots (RLL(X) - RLL(\alpha^{2t-1}))$$

Figure 12:
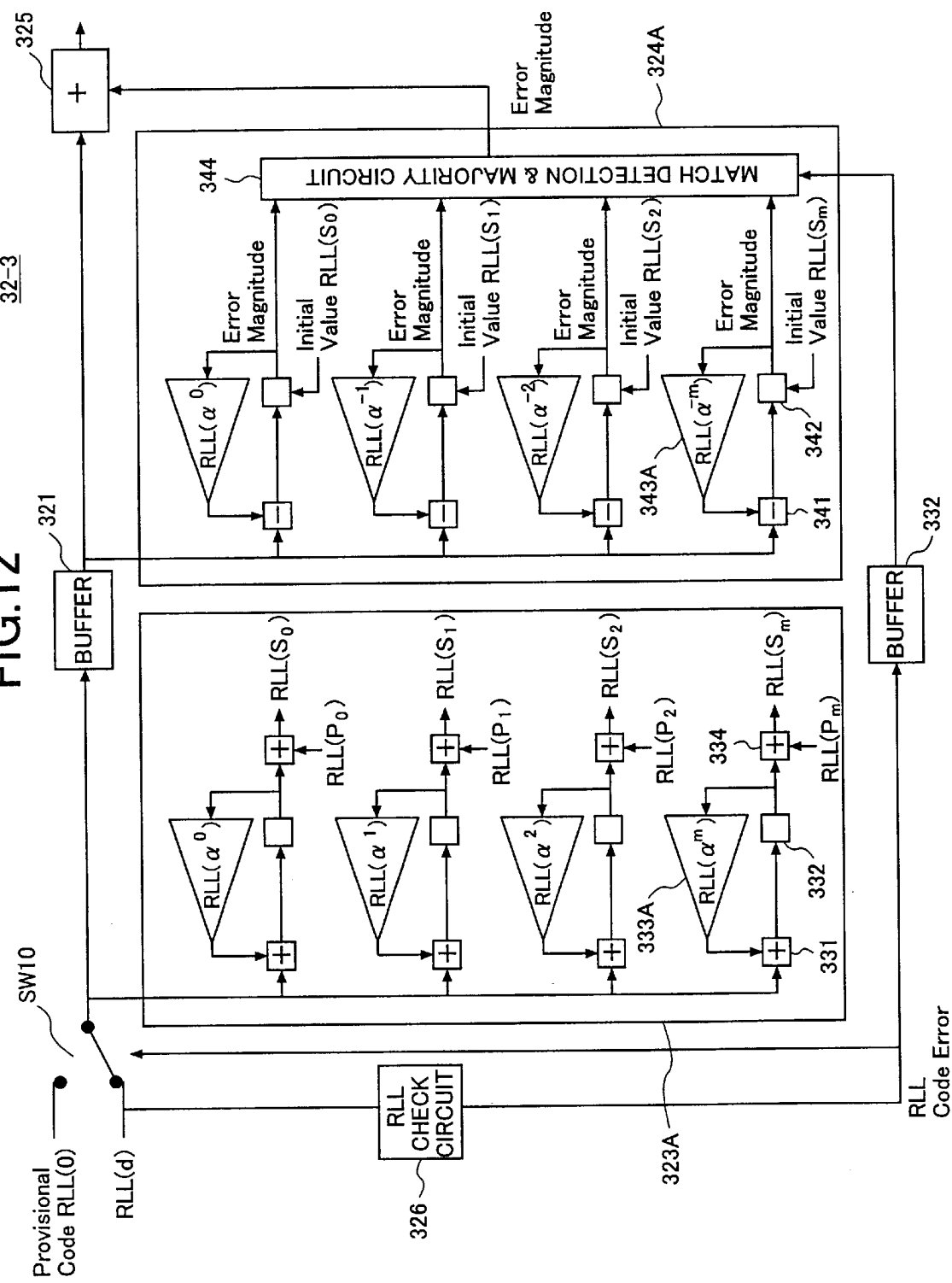
FIG. 12 is a diagram showing an ECC1 decoder of the fourth embodiment of the decoding unit.

FIG. 12 is a diagram showing the ECC1 decoder 3—3 of the decoding unit shown in FIG. 11. In FIG. 12, those parts which are the same as those corresponding parts in FIG. 6 are designated by the same reference numerals, and a description thereof will be omitted.

As shown in FIG. 12, the ECC1 decoder 32-3 includes a switch SW10, buffers 321 and 322, a syndrome computing section 323A, an error computing section 324A which computes the error location and the error magnitude, an adder 325, and a RLL check circuit 326. The RLL restricting portion or a provisional code RLL(o) is input to the buffer 321 via the switch SW10. The RLL check circuit 326 checks the RLL restricting portion and outputs a RLL code error. The RLL code error which is notified from the RLL check section 326 is input to the buffer 322. The RLL code error is also used to control the switching of the switch SW10.

The syndrome computing section 323A is made up of a first circuit part which includes adders 331 and 334, a register 332 and a $RLL(\alpha^i)$ multiplier 333A and is provided to compute a corresponding extended syndrome RLL(Si) based on an extended parity RLL(Pi) and the RLL restricting portion, and one such first circuit part is provided with respect to each of i=0 to m. The syndrome computing section 323A computes the extended syndrome based on an extended syndrome computing formula.

$$\begin{bmatrix} RLL(S0) \\ RLL(S1) \\ RLL(S2) \\ \vdots \\ RLL(Sm) \end{bmatrix} = \begin{bmatrix} 1 & 1 & 1 & \cdots & 1 \\ 1 & RLL(\alpha) & RLL(\alpha^2) & \cdots & RLL(\alpha^m) \\ 1 & RLL(\alpha^2) & RLL(\alpha^4) & \cdots & RLL(\alpha^{2m}) \\ \vdots & \vdots & \vdots & \vdots & \vdots \\ 1 & RLL(\alpha^m) & RLL(\alpha^{2m}) & \cdots & RLL(\alpha^{mm}) \end{bmatrix}$$

$$\begin{bmatrix} RLL(B0) \\ RLL(B1) \\ RLL(B2) \\ \vdots \\ RLL(Bm) \end{bmatrix}$$

The error computing section 324A is made up of a match detection and majority circuit 344 and a second circuit part which includes a subtracter 341, a register 342 and a $RLL(\alpha^{-1})$ multiplier 343A and is provided to compute a corresponding error magnitude based on an initial value of the extended syndrome RLL(Si) and the RLL restricting portion obtained via the buffer 321, and one such second circuit part is provided with respect to each of i=0 to m. The match detection and majority circuit 344 judges the error magnitude based on the error magnitudes obtained from each of the second circuit parts and the RLL code error which is obtained via the buffer 322. The match detection and majority circuit 344 detects whether or not the RLL code error obtained via the buffer 322 matches the error computed in each of the second circuit parts within the error computing section 324A, and obtains the error magnitude by majority if a mismatch is detected. The error magnitude from the match detection and majority circuit 344 is supplied to the adder 325. In other words, since the error position (error location) is definitely decided, it is possible to obtain the error magnitude by majority from the match of the extended syndromes judging the error position and the error magnitude. As a result, the error which is generated in the RLL restricting portion is added to the error location of the ECC1 by the adder 325, and the magnitude of the error generated in the RLL restricting portion can be detected from the output of the match detection and majority circuit 344, thereby making it possible to correct the error of the RLL restricting portion before the RLL decoding.

Therefore, according to this embodiment, it is possible to further suppress the propagation of the burst error, because the error of the RLL code of the RLL restricting portion is corrected by the ECC before carrying out the RLL decoding.

Figure 13:
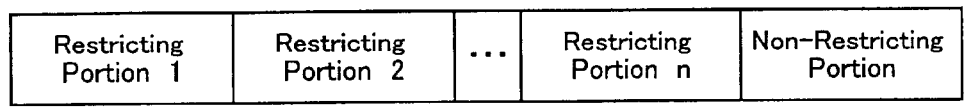
FIG. 13 is a diagram for explaining a RLL code which includes internal codes having different restricting conditions.
Figure 14:
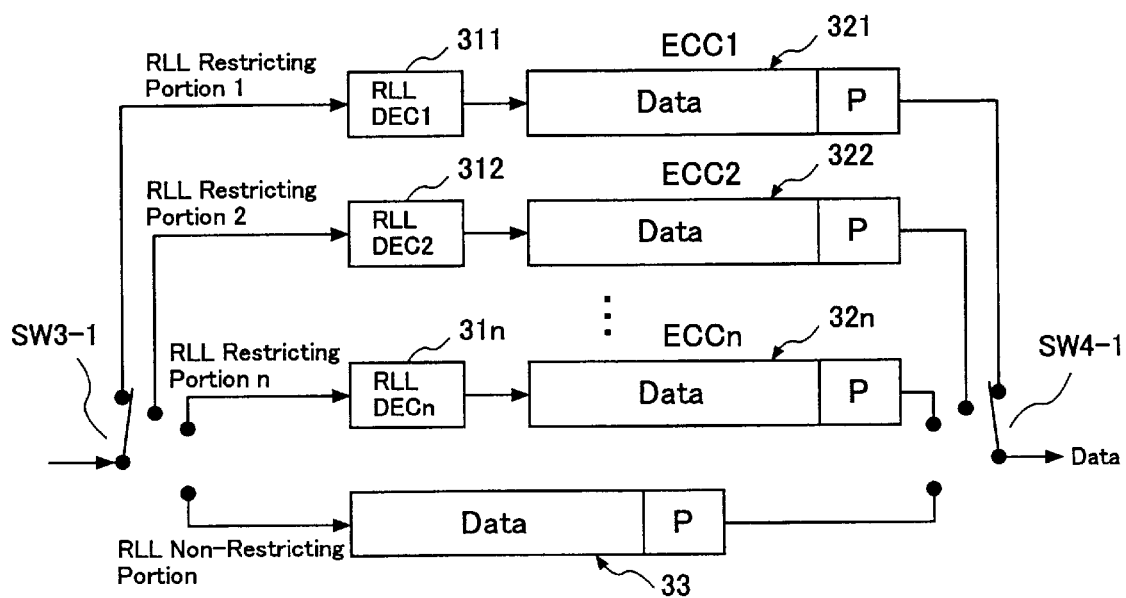
FIG. 14 is a diagram showing a fifth embodiment of the decoding unit according to the present invention.

Next, a description will be given of a fifth embodiment of the decoding unit according to the present invention. FIG. 13 is a diagram for explaining a RLL code which includes internal codes having different restricting conditions. In addition, FIG. 14 is a diagram showing this fifth embodiment of the decoding unit. In FIG. 14, those parts which are the same as those corresponding parts in FIG. 4 are designated by the same reference numerals, and a description thereof will be omitted.

As shown in FIG. 13, the RLL code which includes internal codes having different restricting conditions, includes for example, restricting portions 1 through n and a non-restricting portion. As shown in FIG. 14, a switch SW3-1 of the decoding unit is controlled so as to separate the RLL restricting portion of the RLL code into RLL restricting portions 1 through n, and to also separate the RLL non-restricting portion from the RLL code. Accordingly, each RLL restricting portion j is subjected to a RLL decoding and an error correction using ECCj in a corresponding RLL decoder 31j and a corresponding ECCj decoder 32j, before being supplied to a switch SW4-1, where j=1 to n. On the other hand, the RLL non-restricting portion is subjected to an error correction using the ECC in the ECC decoder 33, before being supplied to the switch SW4-1. By appropriately switching the switch SW4-1, the restricting portions 1 through n which are subjected to the RLL decoding and the error correction and the non-restricting portion which is subjected to the error correction are interleaved, so as to reproduce RLL decoded information which has been subjected to the RLL decoding and the error correction using the ECC.

Of course, it is possible to appropriately combine one or more embodiments described above if desirable.

Further, the present invention is not limited to these embodiments, but various variations and modifications may be made without departing from the scope of the present invention.

What is claimed is:

1. An encoding unit comprising:
   separating means for separating a RLL code into a restricting portion corresponding to a basic code and a non-restricting portion corresponding to information bits;
   first encoding means for adding an error correction code to the restricting portion and carrying out a RLL encoding;
   second encoding means for adding an error correction code to the non-restricting portion; and
   interleaving means for interleaving outputs of said first and second encoding means, and outputting encoded information.

2. The encoding unit as claimed in claim 1, wherein said second encoding means interleaves the non-restricting portion before supplying the non-restricting portion to said interleaving means.

3. The encoding unit as claimed in claim 1, wherein said first encoding means interleaves the restricting portion before supplying the restricting portion to said interleaving means.

4. A decoding unit for decoding encoded information in which first and second information are interleaved, said first information being subjected to a RLL encoding by adding a parity to a restricting portion which corresponds to a basic code of a RLL code, said second information being added with an error correction code to a non-restricting portion which corresponds to information bits of the RLL code, said decoding unit comprising:
   separating means for separating the encoded information into the first and second information;
   first decoding means for subjecting the separated first information to a RLL decoding and an error correction;
   second decoding means for subjecting the separated second information to an error correction; and
   interleaving means for interleaving outputs of said first and second decoding means, and outputting decoded information.

5. The decoding unit as claimed in claim 4, wherein said first decoding means adds an error generated in the first information to an error location of the error correction code.

6. The decoding unit as claimed in claim 5, wherein said first decoding means replaces the error location by a provisional data "0".

7. The decoding unit as claimed in claim 6, wherein said first decoding means judges a magnitude of an error in the error location by majority.

8. The decoding unit as claimed in claim 4, wherein said first decoding means carries out an error correction by use of an extended Galois field using data of the first information as a field thereof.

9. The decoding unit as claimed in claim 4, wherein said first decoding means interleaves internal codes of the first information having different restricting conditions, for each of the restricting conditions.

10. An encoding unit comprising:
    a separating section which separates a RLL code into a restricting portion corresponding to a basic code and a non-restricting portion corresponding to information bits;
    a first encoding section which adds an error correction code to the restricting portion and carries out a RLL encoding;
    a second encoding section which adds an error correction code to the non-restricting portion; and
    an interleaving section which interleaves outputs of said first and second encoding sections, and outputs encoded information.

11. A decoding unit for decoding encoded information in which first information which is subjected to a RLL encoding by adding a parity to a restricting portion corresponding to a basic code of a RLL code and second information which is added with an error correction code to a non-restricting portion corresponding to information bits of the RLL code are interleaved, said decoding unit comprising:
    a separating section which separates the encoded information into the first and second information;
    a first decoding section which subjects the separated first information to a RLL decoding and an error correction;
    a second decoding section which subjects the separated second information to an error correction; and
    an interleaving section which interleaves outputs of said first and second decoding sections, and outputs decoded information.

* * * * *